United States Patent [19]

Stacey

[11] 4,249,134
[45] Feb. 3, 1981

[54] RADIO FREQUENCY DETECTORS

[75] Inventor: William F. Stacey, Saxilby, England

[73] Assignee: AEI Semiconductors Limited, Lincoln, England

[21] Appl. No.: 973,583

[22] Filed: Dec. 27, 1978

[51] Int. Cl.³ .................................................. H03D 1/10
[52] U.S. Cl. .............................. 329/205 R; 329/204; 329/206; 307/317 A
[58] Field of Search ............... 307/317 A; 329/203, 329/204, 205 R, 206

[56] References Cited

U.S. PATENT DOCUMENTS 3,418,587  12/1968  Riebman et al. ................. 329/205 R

OTHER PUBLICATIONS

Microwave Journal, vol. 19, No. 2, pp. 42-44, 60, Feb., 1976, "Low-Barrier Schottky-Diode Detectors" by Szente et al.
Designer's Casebook-Electronics, May 2, 1974, pp. 94-95, "Schottky Diode Pair Makes an RF Detector Stable" by R. J. Turner.

Primary Examiner—John S. Heyman
Attorney, Agent, or Firm—Diller, Ramik & Wight

[57] ABSTRACT

A radio frequency detector uses a Schottky barrier diode as the detection element. In order to protect this diode against damage caused by the application of excessive power, a NIP diode is connected in shunt with the Schottky barrier diode and is positioned very closely adjacent to it with the connecting leads being as short as possible. The NIP diode has a very low internal capacitance, which is compatible with the operation of the Schottky barrier diode as a radio frequency detector.

7 Claims, 4 Drawing Figures

RADIO FREQUENCY DETECTORS

This invention relates to radio frequency detectors.

Such detectors, at present, often use Schottky barrier diodes which can operate satisfactorily at frequencies of several Gigahertz. However, such devices are not capable of handling large power levels and can easily be damaged or destroyed by high voltages or the momentary application of excessive power originating from, for example, pulses or spikes of R.F. power. Protection arrangements which have already been proposed have not been entirely satisfactory, since they either adversely affect the frequency response of the detector or are insufficiently quick acting to protect against very fast voltage spikes. The present invention seeks to provide an improved R.F. detector.

According to this invention, a radio frequency detector includes a Schottky barrier diode and a further semiconductor diode having a very low internal capacitance and being connected in shunt therewith, the further diode being connected in opposite polarity to that of the Schottky barrier diode and being mounted closely adjacent thereto on a common carrier.

In order for the further semiconductor diode to exhibit the required low internal capacitance, it is, preferably, of the kind provided with an intrinsic region between adjacent p-type and n-type semiconductor regions. Preferably again, it is a NIP diode which is such a diode fabricated on a p-type substrate.

Figure 1:
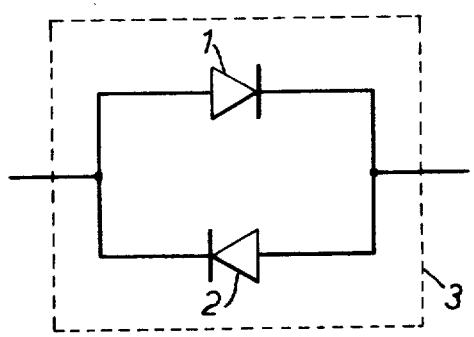
Figure 2:
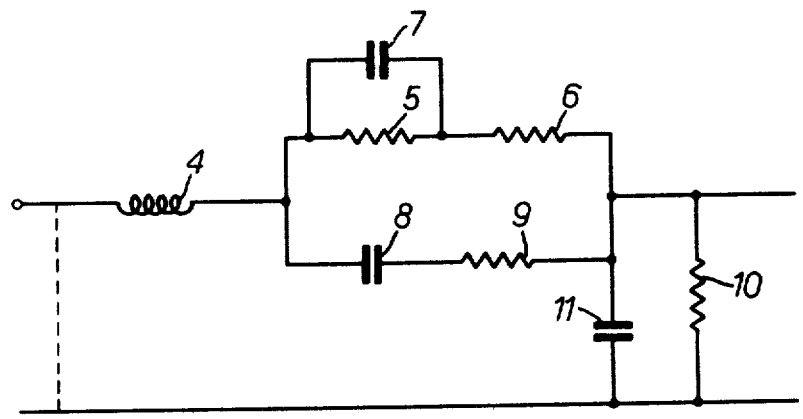
Figure 3:
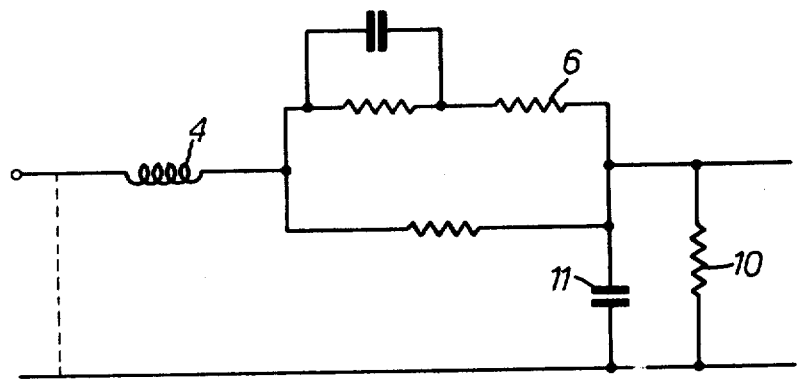
Figure 4:
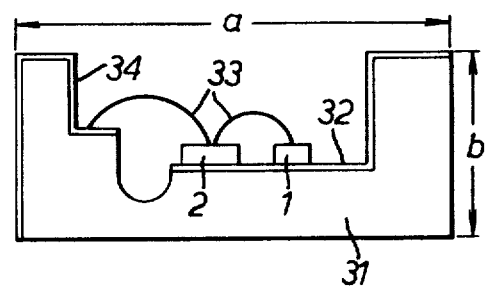

The invention is further described by way of example, with reference to the accompanying drawings in which, FIG. 1 illustrates, very diagrammatically, a radio frequency detector in accordance with the present invention, FIGS. 2 and 3 are explanatory diagrams, and FIG. 4 illustrates a practical device.

The radio frequency detector consists of a Schottky barrier diode 1 connected in shunt with a NIP diode 2. The two diodes are mounted closely adjacent to one another within a common encapsulation 3, represented diagrammatically by the broken line box.

FIG. 2 illustrates the equivalent circuit at low power levels and FIG. 3 illustrates the equivalent circuit at high power levels. The inductance of the package in which the two diodes are mounted is represented by the inductor 4. The Schottky barrier diode 1 is represented by the resistors 5 and 6 and the shunt capacitor 7. The NIP diode is represented by the capacitor 8 and the resistor 9, and the resistor 10 represents the load which the detector feeds. A capacitor 11 represents an R.F. filter. At low power levels, the rectified output from the Schottky diode 1 is not sufficient to forward bias the NIP diode 2 which is, thus, non-conductive.

Thus, the NIP diode 2 looks like a capacitor in series with a small resistance. The effect of this on the performance of the radio frequency detector will be small as long as the series resistance 9 is small which, in practice, will be the case. When the voltage across the load 10 exceeds the foward bias voltage of the NIP diode, which is typically about 0.6 volts, the NIP diode is biassed into forward conduction, thereby shunting the R.F. power into the NIP diode and protecting the Schottky barrier diode. The series resistance 6 of the Schottky barrier diode keeps the impedance of the diode 1 relatively high and causes a greater proportion of the applied power to be directed to the NIP diode and hence to ground via the filter represented by capacitor 11. Additionally, the parasitic inductance 4 of the package enhances the operation, since it becomes proportionately more dominant as the impedance of the NIP diode is reduced.

For satisfactory operation, the load 10 must not exhibit a very low impedance and, in practice, it is thought it should be about 10 ohms or greater, since the detector depends on the voltage generated across the load 10 to apply the forward bias to the NIP diode 2 at high input levels.

Since at low power levels the power predominantly goes into the Schottky barrier diode, and at high power levels into the NIP diode, the power handling capacity of the combination is determined by the NIP diode, and the sensitivity by the Schottky barrier diode.

In normal use as a detector, the Schottky barrier diode is forward biassed, which automatically reverse biasses the NIP diode and the effect of this is to advantageously reduce the capacitance 8 and resistance 9.

If the device is used as a mixer, no bias is applied, and rectified current is produced by a higher input power level than would normally be used on a detector. This means that, for a given input level, there is a limit on the maximum value of the load resistor, since otherwise the NIP diode is affected at an input level which interferes with the low power level operation of the device.

A typical construction is illustrated in FIG. 4 in which the Schottky barrier diode 1 and the NIP diode 2 are mounted on a ceramic housing 31. The two diodes are mounted side-by-side on a gold-plated surface 32 of the housing and a bonding wire 33 connects them electrically to a further gold-plated surface 34. In practice, the housing 31 is inverted and the gold-plated surfaces 35 and 36 are mounted on a circuit with which the device is to be used. This form of housing can be very small. Typically, the chip sizes for the NIP diode and Schottky barrier diode are 0.012" square and 0.006" square respectively, and are mounted on a housing 31 in which the dimension a is 0.075", dimension b is 0.032" and the thickness of the housing is only 0.020".

I claim:

1. A radio frequency detector including a Schottky barrier diode and a further semiconductor diode having a very low internal capacitance and being connected in shunt therewith, the further diode being connected in opposite polarity to that of the Schottky barier diode and being mounted closely adjacent thereto on a common carrier, said further diode establishing a low impedance path for r.f. input applied to the Schottky barrier diode, in shunt therewith, when the r.f. input approaches a power input level which could harm the Schottky barrier diode.

2. A detector as claimed in claim 1 and wherein the further semiconductor diode is of the kind provided with an intrinsic region between adjacent p-type and n-type semiconductor regions.

3. A detector as claimed in claim 2 and wherein the further semiconductor diode is a NIP diode which is such a diode fabricated on a p-type substrate.

4. A detector as claimed in claim 1 and wherein the Schottky barrier diode and the further diode are mounted within a common ceramic housing.

5. An r.f. circuit assembly which comprises:
   a Schottky barrier diode having an input terminal adapted to be connected to a forward biassing r.f. power input and an output terminal adapted to be connected to an external load; and diode means oppositely poled with respect to said Schottky barrier diode for circulating some of the output current produced by said Schottky barrier diode back through the Schottky barrier diode in response to an r.f. power input level of the Schottky barrier diode approaching that which could harm the Schottky barrier diode and for thereby establishing a low impedance path for the r.f. power input in shunt with the Schottky barrier diode.

6. An r.f. circuit assembly as defined in claim 5 wherein said diode means consists of a semiconductor diode having a very low internal capacitance and connected in parallel with but oppositely poled with respect to said Schottky barrier diode.

7. An r.f. circuit assembly as defined in claim 6 wherein said semiconductor diode is an NIP diode.

* * * * *